United States Patent
Chi et al.

(10) Patent No.: US 9,012,986 B2
(45) Date of Patent: Apr. 21, 2015

(54) COMBINATION FINFET AND PLANAR FET SEMICONDUCTOR DEVICE AND METHODS OF MAKING SUCH A DEVICE

(71) Applicant: GLOBALFOUNDRIES Inc., Grand Cayman (KY)

(72) Inventors: Min-hwa Chi, Malta, NY (US); Werner Juengling, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/283,881

(22) Filed: May 21, 2014

(65) Prior Publication Data

US 2014/0252480 A1 Sep. 11, 2014

Related U.S. Application Data

(62) Division of application No. 13/705,261, filed on Dec. 5, 2012, now Pat. No. 8,772,117.

(51) Int. Cl.
*H01L 29/78* (2006.01)
*H01L 21/84* (2006.01)
*H01L 27/12* (2006.01)

(52) U.S. Cl.
CPC ............ *H01L 29/785* (2013.01); *H01L 21/845* (2013.01); *H01L 27/1211* (2013.01)

(58) Field of Classification Search
CPC .. H01L 21/845; H01L 29/785; H01L 27/1211
See application file for complete search history.

(56) References Cited

U.S. PATENT DOCUMENTS

| 7,803,670 B2* | 9/2010 | White et al. ................... 438/151 |
| 2004/0217420 A1* | 11/2004 | Yeo et al. ........................ 257/347 |
| 2005/0218438 A1* | 10/2005 | Lindert et al. ................. 257/296 |
| 2013/0065371 A1 | 3/2013 | Wei et al. |

OTHER PUBLICATIONS

Ahmed and Schuegraf, "Transistor Wars—Rival Architectures Face Off in a Bid to Keep Moore's Law Alive," IEEE Spectrum, pp. 50-53, 63-66, Nov. 2011.

Fujita et al., "Advanced Channel Engineering Achieving Aggressive Reduction of Vt Variation for Ultra-Low-Power Applications," IEDM11-749-752, 2011 IEEE.

Hokazono et al., "Steep Channel Profiles in n/pMOS Controlled by Boron-doped Si:C Layers for Continual Bulk-CMOS Scaling," IEDM09-673-676, 2009 IEEE.

(Continued)

*Primary Examiner* — Roy Potter
*Assistant Examiner* — Paul Patton
(74) *Attorney, Agent, or Firm* — Amerson Law Firm, PLLC

(57) ABSTRACT

A device includes a plurality of trenches and fins defined in a substantially un-doped layer of semiconducting material, a gate insulation layer positioned on the fins and on the bottom of the trenches, a gate electrode and a device isolation structure. One method disclosed herein involves identifying a top width of each of a plurality of fins and a depth of a plurality of trenches to be formed in a substantially un-doped layer of semiconducting material, wherein, during operation, the device is adapted to operate in at least three distinguishable conditions depending upon a voltage applied to the device, performing at least one process operation to define the trenches and fins in the layer of semiconducting material, forming a gate insulation layer on the fins and on a bottom of the trenches and forming a gate electrode above the gate insulation layer.

26 Claims, 11 Drawing Sheets

(56) References Cited

OTHER PUBLICATIONS

Khakifirooz et al., "Challenges and Opportunities of Extremely Thin SOI (ETSOI) CMOS Technology for Future Low Power and General Purpose System-on-Chip Applications," pp. 110-111, 978-1-4244-5065-7/10, 2010 IEEE.

Maleville, "Extending planar device roadmap beyond node 20nm through ultra thin body technology," 978-1-4244-8492-8/11, 2011 IEEE.

Nowak et al., "Turning Silicon on its Edge—Overcoming silicon scaling barriers with double-gate and FinFET technology," IEEE Circuits & Devices Magazine, pp. 20-31, Jan./Feb. 2004.

Redolfi, "Bulk FinFET Fabrication with New Approaches for Oxide Topography Control Using Dry Removal Techniques".

Sugiyama et al., "Temperature effects on Ge condensation by thermal oxidation of SiGe-on-insulator structures," J. Appl. Phys., 95:4007-11, 2004.

Tezuka et al., "Strained SOI/SGOI dual-channel CMOS technology based on the Ge condensation technique," Second. Sci. Technol., 22:S93-98, 2007.

\* cited by examiner

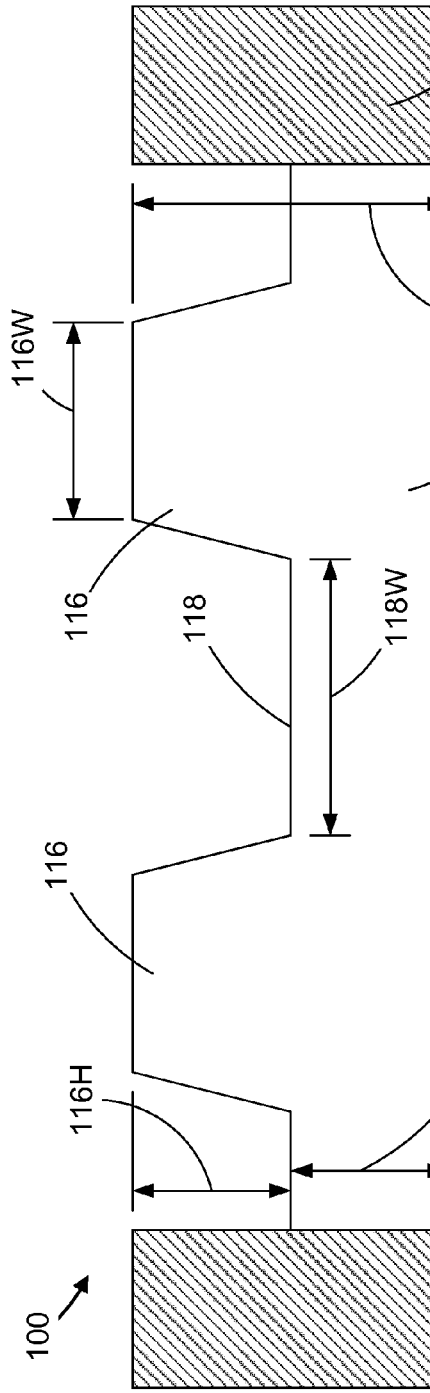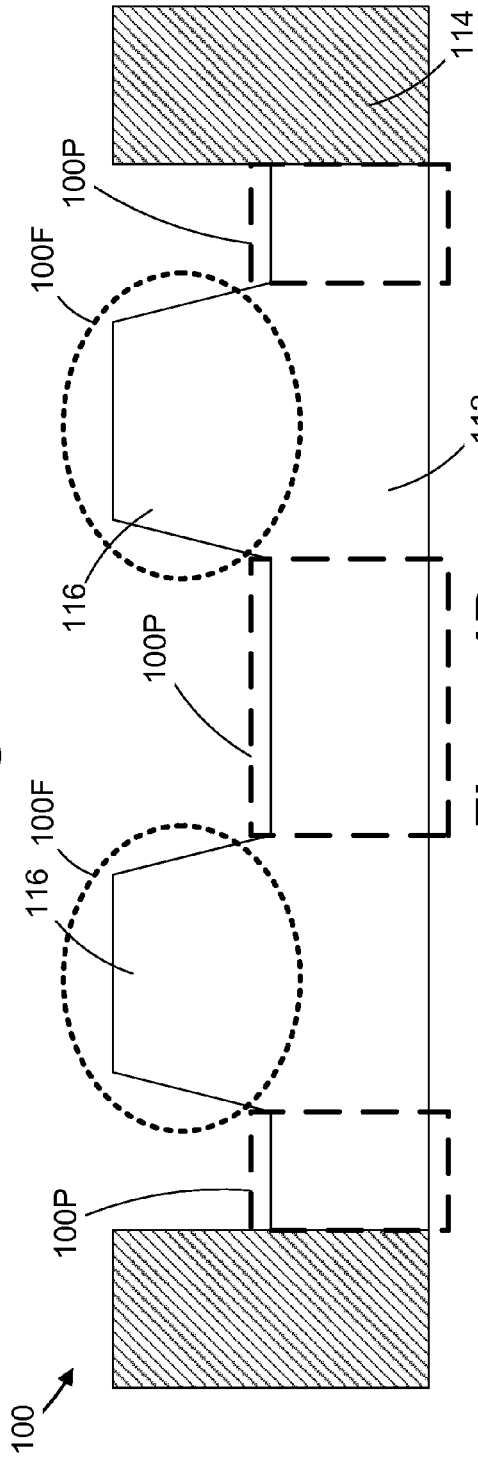

Figure 11 from A. Khakifirooz, et.al. "Challenges and Opportunities of Extremely Thin SOI (ETSOI) CMOS Technology for Future Low Power and General Purpose System-on-Chip Applications ", VLSI-TSA, p.110, 2010.

$V_{Tlin}$ = Linear mode $V_t$ $V_{Tsat}$ = Saturation mode $V_t$

US 9,012,986 B2

COMBINATION FINFET AND PLANAR FET SEMICONDUCTOR DEVICE AND METHODS OF MAKING SUCH A DEVICE

CROSS-REFERENCE TO RELATED APPLICATION

This is a divisional of co-pending application Ser. No. 13/705,261, filed Dec. 5, 2012.

BACKGROUND OF THE INVENTION

1. Field of the Invention

Generally, the present disclosure relates to the manufacture of sophisticated semiconductor devices, and, more specifically, to a combination FINFET and planar FET semiconductor device and various methods of making such a device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region. The above description is applicable for both the N-type FET as well as the P-type FET, except that the polarity of voltage in operation and the doping type of the source, the channel and the drain regions are correspondingly reversed. In so-called CMOS (Complementary Metal Oxide Semiconductor) technology, both N-type and P-type MOSFETs (which are referred to as being "complementary" to each other) are used in integrated circuit products. CMOS technology is the dominant technology as it relates to the manufacture of almost all current-day large scale logic and memory circuits.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain, which is commonly referred to as a "punch-through" of the electrical potential from the drain to the source and leads to larger leakage currents. This is sometimes referred to as a so-called short channel effect, wherein the characteristic of the FET as an active switch is degraded.

In contrast to a planar FET, which has a planar structure, there are so-called three-dimensional (3D) devices, such as an illustrative FinFET device, which is a three-dimensional structure. More specifically, in a FinFET, a generally vertically positioned, fin-shaped active area is formed and a gate electrode encloses both of the sides and the upper surface of the fin-shaped active area to form a "tri-gate" structure so as to use a channel having a 3D "fin" structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width in the "fin" channel (as a result of the better electrostatic characteristics of the tri-gate or dual-gate structure around the fin channel) and thereby reduce so-called short channel effects. Also, in a FinFET, the junction capacitance at the drain region of the device is greatly reduced, which tends to reduce at least some short channel effects.

In one embodiment, FinFET devices have been formed on so-called silicon-oninsulator (SOI) substrates. An SOI substrate includes a bulk silicon layer, an active layer and a buried insulation layer made of silicon dioxide (a so-called "BOX" layer) positioned between the bulk silicon layer and the active layer. Semiconductor devices are formed in and above the active layer of an SOI substrate. The fins are formed in the active layer and the buried insulation layer provides good isolation between adjacent fins. The processes used to form FinFET devices on SOI substrates have relatively good compatibility with various processes that are performed when forming planar transistor devices in CMOS applications. For example, in both applications, the gate stack and the gate insulation layer can be made of the same materials (as in planar CMOS on SOI), e.g., poly-SiON or high-kc/metal-gate (HKMG), and both applications may involve performing various epitaxial silicon growth processes (e.g., SiGe for PMOS and raised SD for NMOS) as well as the formation of episilicon material on the fins so as to define the source/drain regions from the FinFET devices that provide good resistance and desirable stress characteristics. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive current than planar transistor devices. Additionally, the leakage current of FinFET devices after the device is turned "OFF" is significantly reduced as compared to the leakage current of planar transistor MOSFETs due to the superior gate electrostatic control of the "fin" channel on FinFET devices. In short, the 3D structure of a FinFET device is a superior MOSFET structure as compared to that of a planar MOSFET, especially in the 20 nm CMOS technology node and beyond.

Recently, device manufacturers have become more interested in forming FinFET devices on bulk silicon substrates in an effort to reduce costs and to make the FinFET formation processes more compatible with planar CMOS process operations. However, use of a bulk substrate typically requires the formation of shallow trench isolation (STI) regions in the substrate to electrically isolate the devices. The fins of a FinFET device only need to have a relatively shallow or small fin height, e.g., about 20-40 nm. In contrast, the STI regions that are formed to electrically isolate adjacent Fin-FET devices are typically required to be much deeper (or taller), e.g., about 100-300 nm, than the height of the fins. Typically, a plurality of trenches are formed in the substrate to define the areas where STI regions will be formed and to define the initial structure of the fins, and these trenches are typically formed in the substrate during the same process operation for processing simplicity. The trenches are desirably designed with the same pitch (for better resolution during lithography) and they are formed to the same depth and width (for processing simplicity), wherein the depth of the trenches is sufficient for the needed fin height and deep enough to allow formation of an effective STI region. After the trenches are formed, a layer of insulating material, such as silicon dioxide, is formed so as to overfill the trenches. A chemical mechanical polishing (CMP) process is then performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

However, as the dimensions of the fins and the fin-pitch on FinFET devices has decreased, problems arose with manufacturing the isolation structures and fins formed at the same process step with the same pitch and same trench depth. One possible solution that was attempted to address this problem was to form the very small fins in regions that were separated by relatively larger isolation regions. However, this approach was difficult to implement in production due to the formation of "fatter" fins, or fins having an abnormal profile, immediately adjacent to the larger isolation region than those fins not immediately adjacent to the larger isolation region. The formation of such "fatter" or abnormal fins was due, at least in part, to the non-uniform spacing between various structures on the substrate. The formation of such "fatter" or abnormal fins (sometimes referred to as the "first fin" effect) resulted in large variations in the threshold voltage of FinFET devices, a characteristic which is highly undesirable in conventional FinFET technology. Other problems include high defect density (broken fins), difficult gap-fill (small pitch and high aspect ratio) and variations in fin profile, etc. One manufacturing technique that is employed in manufacturing FinFET devices so as to eliminate the "first fin" effect is to initially form a so-called "sea-offins" (with equal fin width and spacing or fin pitch everywhere) across the substrate, and thereafter performing an extra masking and etching step to remove some of the fins where larger isolation structures will be formed. Using this "sea-of-fins" type manufacturing approach, better accuracy and uniformity may be achieved in forming the fins to very small dimensions due to the more uniform environment in which the lithography and etching processes that form the trenches that define the fins is performed. As mentioned, after the "sea-of-fins" has been formed, an extra mask layer was formed and an extra etching process was performed to remove some of the fins to create room for or define the spaces where isolation regions will ultimately be formed, which increases the cost and processing complexity of such an approach.

The formation of planar transistor devices in CMOS technology has also evolved and continues to evolve to produce devices with improved operational characteristics. One relatively recent advance involves the use of low channel doping (i.e., super-steep channel doping profiles) for deeply depleted channel regions during device operation, where there are multiple epi layers (i.e., Boron-doped-Silicon (Si:B), Carbon-doped Silicon (Si:C) and non-doped Silicon) formed above N/P wells. In such a device, the suppression of boron (B). phosphorous (P) and arsenic (As) diffusion is mainly due to the presence of the carbon-doped silicon layer (Si:C) layer. Alternatively, instead of using epitaxial growth processes, the B-doped and C-doped silicon layers can be formed by implanting boron and carbon into the silicon substrate. The low doping of the channel region may suppress or reduce the so-called "short-channel effect" typically found on traditional planar transistor devices manufactured on bulk silicon, reduce variations in the threshold voltages of such devices (due to less random dopant fluctuations), reduce source/drain leakage currents (by punch-through suppression by those doped layers below the channel) and lower junction capacitances. Therefore, MOSFET devices formed on a bulk substrate with a low doped channel can enjoy the advantages of devices with fully depleted channel regions during operations as if they are fabricated on an SOI substrate.

It is generally known that fully depleted devices with a substantially un-doped or low-doped channel region are effective in reducing threshold voltage variability due to the elimination of random dopant fluctuations in such devices, and that such devices exhibit improved device performance with relatively low dynamic power requirements, low leakage currents and relatively high transistor density. The fully depleted devices can take the form of planar transistor devices with ultra-thin bodies formed on SOI substrates or three-dimensional devices, such as FINFET devices. However, the planar devices consume a substantial amount of plot space (or foot-print) in the channel width direction and, with respect to FINFET technology, there are significant challenges in forming deep fin/isolation trenches and filling such trenches without creating undesirable voids.

The present disclosure is directed to a combination FIN-FET and planar FET semiconductor device and various methods of making such a device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a combination FINFET and planar FET semiconductor device and various methods of making such a device. One illustrative device disclosed herein includes a substantially un-doped layer of a semiconducting material, a plurality of trenches and fins defined in the substantially un-doped layer of semiconducting material, a gate insulation layer positioned on the fins and on the bottom surface of the trenches, a gate electrode positioned above the gate insulation layer and a device isolation structure defined in the layer of semiconducting material.

One illustrative method disclosed herein involves identifying a top width of each of a plurality of fins and a depth of each of a plurality of trenches to be formed in a substantially un-doped layer of semiconducting material, wherein, during operation, the device is adapted to operate in at least three distinguishable conditions depending upon a voltage applied to the device, performing at least one process operation to define the trenches and fins in the layer of semiconducting material, forming a gate insulation layer on the fins and on a bottom of the trenches and forming a gate electrode above the gate insulation layer.

Another illustrative method disclosed herein involves forming a combination device in a substantially un-doped layer of semiconducting material, wherein the combination device is comprised of a plurality of spaced-apart FinFET portions, each of which are comprised of at least one fin, and a plurality of substantially planar FET portions. In this example, the method includes the steps of identifying a target threshold voltage for the combination device, identifying at least one of a target top width of each of the fins or a target thickness of the substantially planar FET portions such that, during operation, the combination device is intended to exhibit the target threshold voltage, forming a plurality of trenches in the substantially un-doped layer of semiconducting material so as to define the fins and the planar FET portions, wherein each of the fins have a top width that is approximately equal to the target top width, and the substantially planar FET portions have a thickness that is approximately equal to the target thickness, forming a gate insulation layer on the plurality of fins and on an upper surface of the substantially planar FET portions and forming a gate electrode above the gate insulation layer.

Yet another illustrative method disclosed herein involves forming a combination device in a substantially un-doped layer of semiconducting material, wherein the combination device is comprised of a plurality of spaced-apart FinFET portions, each of which are comprised of at least one fin, and a plurality of substantially planar FET portions. In this example, the method comprises identifying a target threshold voltage that is the same for the FinFET portions and the substantially planar FET portions, identifying a target top width of each of the fins such that, during operation, the FinFET portions are intended to exhibit the target threshold voltage, identifying a target thickness of the substantially planar FET portions such that, during operation, the planar FET portions are intended to exhibit the target threshold voltage, forming a plurality of trenches in the substantially un-doped layer of semiconducting material so as to define the plurality of fins and the substantially planar FET portions, wherein each of the fins have a top width that is approximately equal to the target top width, and the substantially planar FET portions have a thickness that is approximately equal to the target thickness, forming a gate insulation layer on the plurality of fins and on an upper surface of the substantially planar FET portions, and forming a gate electrode above the gate insulation layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict one illustrative embodiment of a novel combination device comprised of FINFET and planar FET device portions disclosed herein;

Figure 1C:
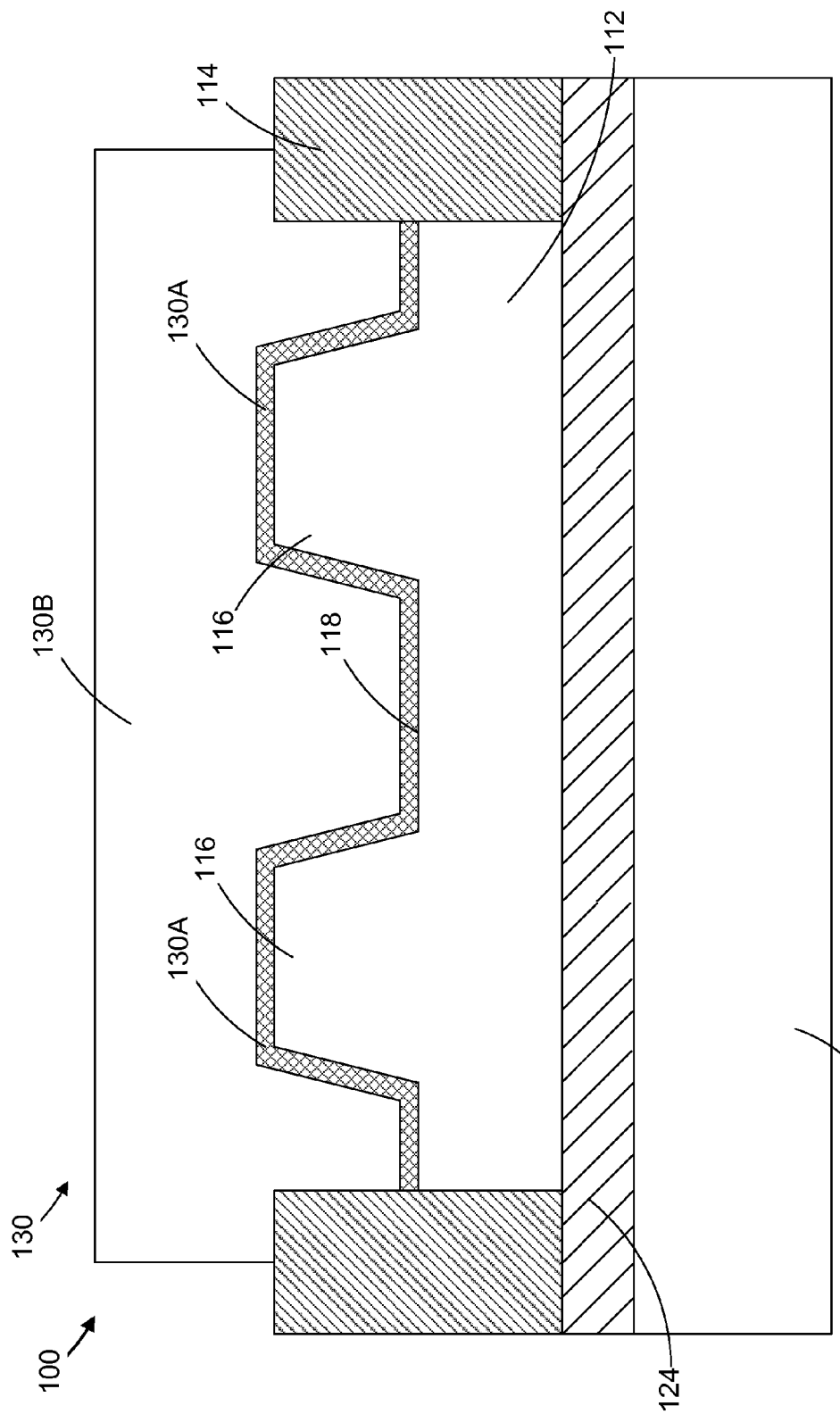

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a combination FIN-FET and planar FET semiconductor device and various methods of making such a device. As will be readily apparent to those skilled in the art upon a complete reading of the present application, the methods disclosed herein may be employed in manufacturing a variety of different devices, including, but not limited to, logic devices, memory devices, etc., and they may be employed with respect to a variety of different technologies, e.g., N-type devices, P-type devices, CMOS applications, etc. With reference to the attached figures, various illustrative embodiments of the methods and devices disclosed herein will now be described in more detail.

FIGS. 1A-1C show a simplified view of one illustrative embodiment of a combination FINFET and planar FET semiconductor device 100 disclosed herein at an early stage of manufacturing. The device 100 is comprised of a substantially un-doped layer of semiconducting material 112 that is electrically isolated from adjacent structures by illustrative isolation regions 114. The structure depicted in FIG. 1A may be formed above a variety of different structures, e.g., the buried insulation layer of an SOI substrate, a bulk substrate, etc., as described more fully below. The device 100 may be either an N-type device or a P-type device.

With continuing reference to FIG. 1A, a plurality of trenches 118 are formed in the substantially un-doped layer of semiconducting material 112 using known masking and etching techniques. The trenches 118 define a plurality of illustrative fins 116. In one illustrative embodiment, the substantially un-doped layer of semiconducting material 112 may have an overall thickness of about 20-80 nm. Although the depth of the trenches 118 may be varied for purposes to be described more fully below, in one illustrative embodiment, the depth of the trenches 118, which corresponds to the height 116H of the fins 116, may be equal to about one-half of the overall thickness 120 of the substantially un-doped layer of semiconducting material 112. In this example, the thickness 122 of the substantially un-doped layer of semiconducting material 112 where the trenches 118 are formed may also be about one-half of the overall thickness 120. The width 116W of the fins 116 may vary depending upon the particular application, e.g., 20-50 nm. Similarly, the width 118W of the trenches 118 (at the bottom) may also vary depending upon the particular application, e.g., 20-50 nm.

With reference to FIG. 1B, the combination device 100 is generally comprised of a plurality of spaced-apart FinFET device portions 100F and a plurality of substantially planar FET device portions 100P that are all formed in a substantially un-doped layer of semiconducting material 112. The bottom of the trenches 118 defines the upper surface of the substantially planar FET device portions 100P. This upper surface of the substantially planar FET device portions 100P defines a planar channel region for the combination device 100. As described more fully below, by manufacturing the combination device 100 in specific ways, the threshold voltage levels of the FINFET device portions 100F and the substantially planar FET device portions 100P of the overall combination device 100 may be individually adjusted. As one example, such adjustment capability may be employed so as to provide, if desired, a so-called multi-level logic device capability that may be used in future multi-level logic level integrated circuit devices instead of, or in addition to, the traditional dual-state integrated circuits that employ transistors that exhibit only two states: ON or OFF.

FIG. 1C depicts the combination device 100 after an illustrative gate structure 130 comprised of an illustrative gate insulation layer 130A and an illustrative gate electrode 130B has been formed on the device 100. As shown in FIG. 1C, an illustrative gate structure 130 is formed for the FinFET devices. An illustrative gate cap layer (not shown) may also be present at this time above the illustrative gate electrode 130B. As will be recognized by those skilled in the art after a complete reading of the present application, the gate structure 130 of the combination device 100 depicted in the drawings, i.e., the gate insulation layer 130A and the gate electrode 130B, is intended to be representative in nature. For example, the gate insulation layer 130A may be comprised of a variety of different materials, such as, for example, silicon dioxide, a high-k (k greater than 10) dielectric material (where k is the relative dielectric constant), etc. The gate electrode 130B may be comprised or one or more layers of conductive material, e.g., doped polysilicon, one or more layers of metal, a metal nitride, etc. The gate structure 130 may be formed using either "gate-first" or "replacement gate" (also known as "gate-last") techniques.

Figure 1D:
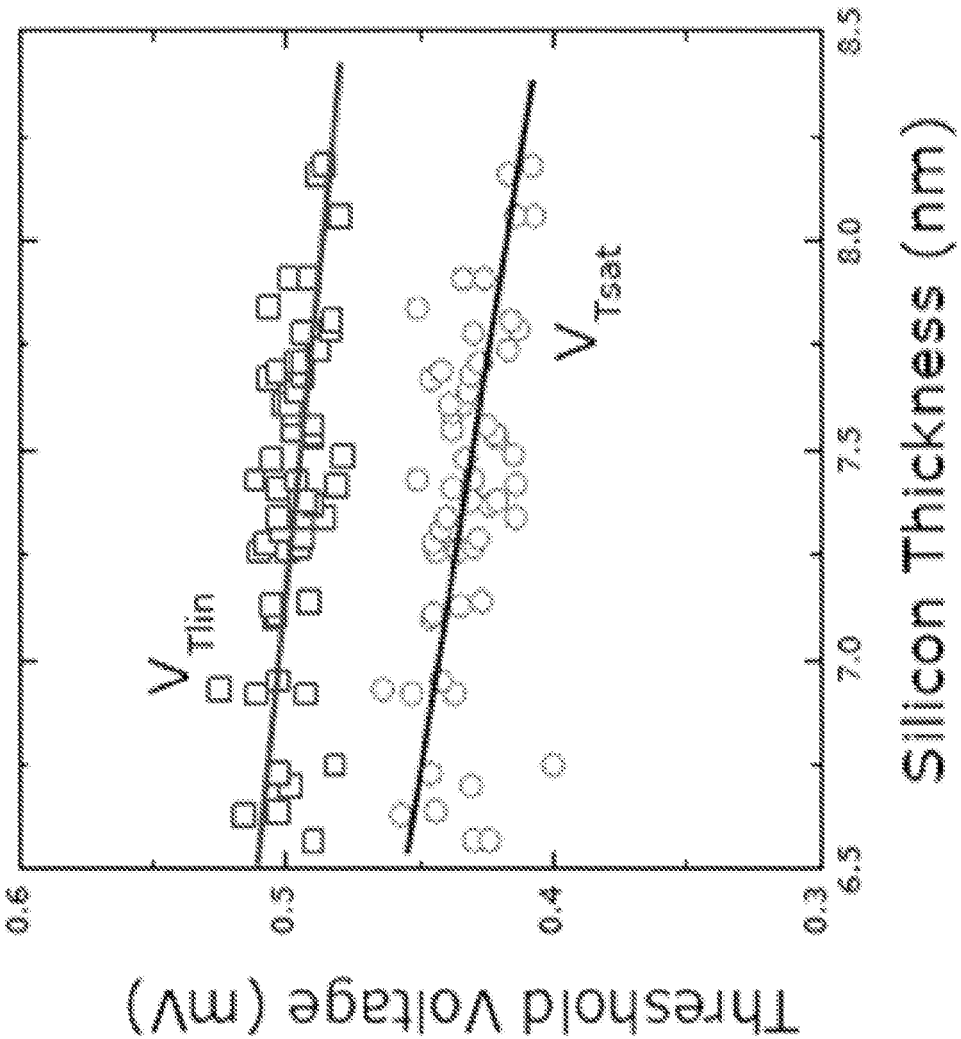
FIG. 1D is a graph from a prior art reference.

In general, with reference to FIGS. 1A and 1B, the threshold voltage ($V_t$) of the planar FET device portions 100P of the overall combination device 100 is dependent upon the thickness 122 of the substantially un-doped layer of semiconducting material 112 in the area of the planar FET device portions 100P. FIG. 1D is a graph from a prior art reference showing that the threshold voltage of a planar MOS transistor on ultra-thin-body SOI depends upon the thickness of the silicon channel, e.g., there is approximately a 25 mV change in threshold voltage per nm change of silicon thickness. FIG. 1D is a graph depicting the threshold voltage (for turning on the device) when the FET portions are in a saturation mode ($V_{Tsat}$) and a linear mode ($V_{Tlin}$) of operation. For example, if the thickness 122 is increased, the threshold voltage of the planar FET device portions 100P of the overall device 100 decreases due to a smaller electrical field in the planar FET device portions 100P. Thus, adjusting the thickness 122 of the planar FET device portions 100P is one means or "knob" that may be adjusted to fine tune the threshold voltage of the overall combination device 100. Similarly, the threshold voltage of the FINFET device portions 100F of the overall combination device 100 may be adjusted or "tuned" by changing the top width 116W of the fins 116. For example, increasing the top width 116W of the fins 116 results in a decrease in the threshold voltage of the FINFET device portions 100F. Thus, if desired, the threshold voltage of the FINFET device portions 100F and the threshold voltage of the substantially planar FET device portions 100P can be adjusted or fine tuned to the same approximate value by adjusting the top width 116W of the fins 116 (of the FINFET device portions 100F) and the thickness 122 (of the substantially planar FET device portions 100P). Accordingly, the combination device 100 may exhibit a much larger drive current after the combination device 100 is turned "ON" than a corresponding FINFET only device or a planar FET only device occupying the same foot-print.

On the other hand, using these various control "knobs," the threshold voltage of the FINFET device portions 100F and the substantially planar FET device portions 100P can be adjusted or "tuned" precisely to different levels or values such that the overall combination device 100 may be adjusted or tuned to be partially or fully turned "ON", thereby permitting it to be used as a multi-current device. One illustrative example where such a multi-current device may be useful is in so-called multi-value integrated circuits. In traditional digital circuitry, transistors may be in one of two discrete states: "ON" or "OFF", which may correspond to a logical "1" or "0" in a binary logic circuit. It is anticipated that, in the future, integrated circuits that employ so-called multi-value logic may be employed to increase operating efficiency and speed. Such multi-value logic circuits will need semiconductor devices that can reflect more than the standard ON/OFF conditions of traditional transistor devices. The combination device 100 disclosed herein may be employed as a multi-value logic transistor. For example, the device 100 may be operated in at least three distinct and detectable states:

1. logical condition "0"—the voltage applied to the combination device 100 is below the threshold voltage of both the FINFET device portions 100F and the planar FET device portions 100P, thereby resulting in no detectable or insignificant current flow;
2. logical condition "1"—the voltage applied to the combination device 100 is above the threshold voltage of either the FINFET device portions 100F or the planar FET device portions 100P, but not both, thereby resulting in an intermediate level of current flow that may be detected using traditional circuitry; and
3. logical condition "2"—the voltage applied to the combination device 100 is above the threshold voltage of both the FINFET device portions 100F and the planar FET device portions 100P, thereby resulting in the maximum current flow through the combination device 100, wherein this maximum current flow is greater than the intermediate current flow in logic condition "1" and the difference in current levels is large enough that this maximum current flow may be readily detected and distinguished from the intermediate level current using traditional circuitry.

One illustrative method disclosed herein involves identifying a target threshold voltage for the combination device 100, identifying one or both of (a) a target top width of each of the fins 116 of the FINFET device portions 100F or (b) a target thickness of the substantially planar FET portions 100P such that, during operation, the combination device 100 is intended to exhibit the target threshold voltage. The method further includes forming a plurality of trenches 118 in the substantially un-doped layer of semiconducting material 112 so as to define the fins 116 of the FINFET device portions 100F and the planar FET portions 100P, wherein each of the fins 116 have a top width 116W that is approximately equal to the target top width, and the substantially planar FET portions 100P have a thickness 122 that is approximately equal to the target thickness. In this example, the method concludes with the steps of forming the gate structure 130 around the fins 116 and in the trenches 118 above the substantially planar FET portions 100P. This method is very flexible in terms of product design as the target threshold voltage for the overall combination device 100P may be comprised of a target threshold voltage for the FinFET device portions 100F that is greater than, less than or substantially equal to a target threshold voltage for the substantially planar FET portions 100P. The threshold voltage values can be realized by adjusting the width 116W of the fins 116 (of the FinFET device portions 100F) and/or by adjusting the channel thickness 122 of the planar FET device portions 100P. For example, the combination device 100 may be constructed such that the top width 116W of the fins 116 is less than or greater than the thickness 122 of the substantially planar FET portions 100P. In such a case, if the top width 116W of the fins 116 is less than the thickness 122 of the substantially planar FET portions 100P, the FinFET portions 100F will exhibit a larger threshold voltage than that of the substantially planar FET portions 100P. Similarly, if the thickness 122 is less than the top width 116W, then the substantially planar FET portions 100P will exhibit a larger threshold voltage than that of the FinFET portions 100F. Furthermore, following the same reasoning, there can be multiple widths 116W of the fins 116 (by layout design) for the FinFET device portions 100F and multiple channel thicknesses 122 (for planar FET device portions 100P) formed in the combination device 100, so that there are "n" number of threshold voltages for the FinFET device portions 100F and "m" number of threshold voltages for the planar FET device portions 100P. Thus, the overall combination device 100 may have (n+m+1) turn-on "states" which represent multiple logic values (n+m+1). Of course, the difference between threshold voltage levels cannot be too small for electrical detection. Thus, the digital numbers "n" and "m" have a practical limit of being less than 3. In the example depicted herein, for simplicity and to facilitate understanding of the presently disclosed inventions, the FinFET device portions 100F and the planar FET device portions 100P of the combination device 100 each only have a single threshold voltage level, i.e., n=1 and m=1.

Yet another illustrative method disclosed herein involves identifying a target threshold voltage that is approximately the same for both the FinFET portions 100F and the substantially planar FET portions 100P, identifying a target top width of each of the fins 116 such that, during operation, the FinFET device portions 100F are intended to exhibit the target threshold voltage, and identifying a target thickness of the substantially planar FET portions 100P such that, during operation, the planar FET portions 100P are intended to exhibit the target threshold voltage. The method then involves the steps of forming a plurality of trenches 118 in the substantially un-doped layer of semiconducting material 112 so as to define the plurality of fins 116 and the substantially planar FET portions 100P, wherein each of the fins 116 has a top width 116W that is approximately equal to the target top width, and the substantially planar FET portions 120 have a thickness 122 that is approximately equal to the target thickness, and forming the gate structure 130 around the fins 116 and in the trenches 118 above the substantially planar FET portions 100P.

FIG. 2A-2G depict one illustrative example of forming the combination device 100 above comprised of a semiconducting substrate 12 having an upper surface 12S. The illustrative substrate 12 may be a bulk semiconducting substrate, or it may be the silicon active layer of a so-called SOI substrate. Thus, the terms "substrate" or "semiconducting substrate" should be understood to cover all semiconducting materials and all forms of such material.

In the embodiment depicted in FIGS. 2A-2G, a substantially up-doped layer of epitaxially formed semiconducting material, e.g., silicon, will eventually be formed above the upper surface 12S of the substrate 12. Thereafter, the combination device will be formed in the substantially up-doped layer of epitaxially formed semiconducting material.

Initially, a plurality of alignment marks (not shown) are formed in the substrate 12 by etching the marks into the substrate 12 through a patterned etch mask (not shown), such as a patterned layer of photoresist material. The alignment marks, as the name implies, will be used to accurately position the location of various doped regions and structures that will be formed in and above the substrate 12, as described more fully below. The alignment marks may be any type of alignment mark that may be employed in manufacturing semiconductor devices and they may be of any style or configuration (e.g., a cross, a chevron pattern, etc.). The number and location of the alignment marks may vary depending on the particular application, lithography scanners and/or the device under construction. For example, the alignment marks may be located in the scribe lines (not shown) of the substrate 12 or they may be located on one or more of the die (not shown) that are on the substrate 12, or in a combination of such locations.

The combination device 100 may be either an N-type or P-type device. Thus, the substrate 12 may have various doped wells (not shown) formed therein as is customary in the fabrication of integrated circuit devices. For example, prior to the formation of any isolation regions in the substrate 12, a P-doped well region (not shown) or an N-doped well region (not shown) may be formed in the substrate 12 by performing known ion implantation and masking techniques. As will be recognized by those skilled in the art after a complete reading of the present application, an illustrative N-type combination device 100 would be formed above a P-doped region (also referred to as a P-well), while an illustrative P-type combination device would be formed above an N-doped region (also referred to as an N-well). The amount of doping, the dopant species used and the depth of the doped regions may vary depending upon the particular application.

As will be described more fully below, in one illustrative embodiment, the combination device 100 may be formed with super-steep channel profiles similar in concept to those described in the background section when discussing prior art planar transistor devices used in CMOS applications. In general, such super-steep channel profiles may be formed by forming doped eptiaxially grown layers of a semiconductor material and/or by performing ion implantation processes to form doped regions in a semiconducting material, such as the substrate 12. The super-steep channel profiles disclosed herein may be formed by performing only epitaxial growth/deposition processes, by performing only ion implantation processes or by performing any combination of epitaxial growth/deposition processes and ion implantation processes in any desired order. Thus, when it is stated in this specification and in the claims that a "doped layer" is formed relative to another structure or layer, it should be understood that such a "doped layer" may be formed by an epitaxial growth/deposition process or it may be a doped implant region formed in a semiconducting substrate, such as the illustrative substrate 12. Accordingly, the present inventions should not be considered to be limited to the manner in which the doped layers that are part of the super-steep profile are formed. FIGS. 2B-2C depict an illustrative example wherein various doped layers are formed by only using epitaxial growth/deposition processes, while FIGS. 2D-2E depict the illustrative situation where the doped layers are formed by performing only ion implantation processes.

Figure 2A:
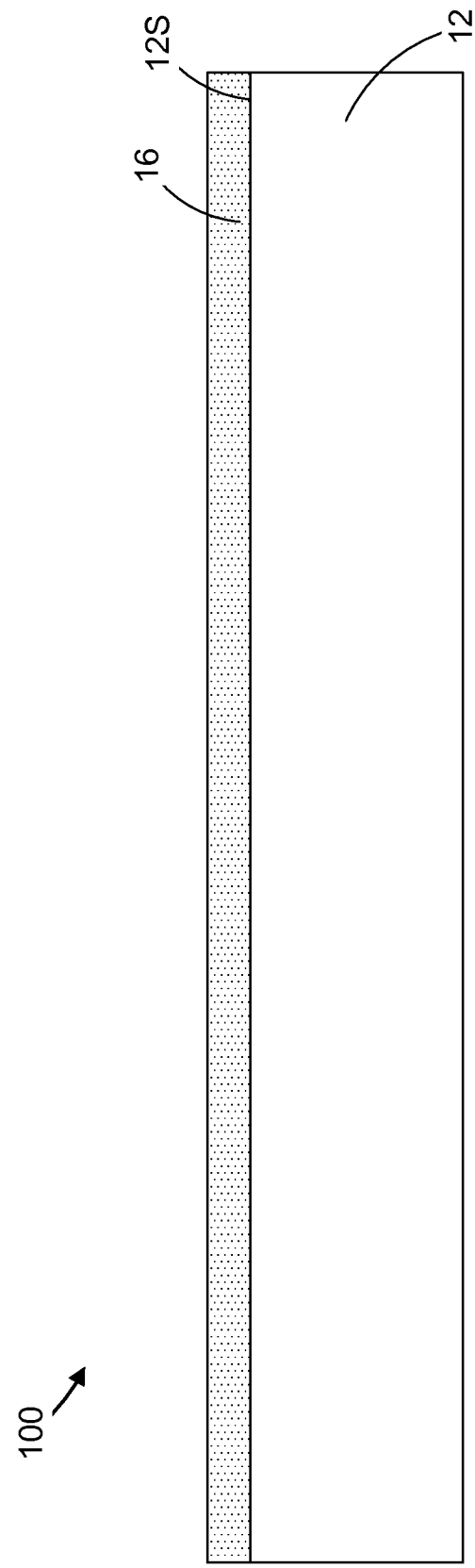
FIGS. 2A-2G depict one illustrative method disclosed herein of forming a novel combination semiconductor device comprising FINFET and planar FET semiconductor device portions.
Figure 2B:
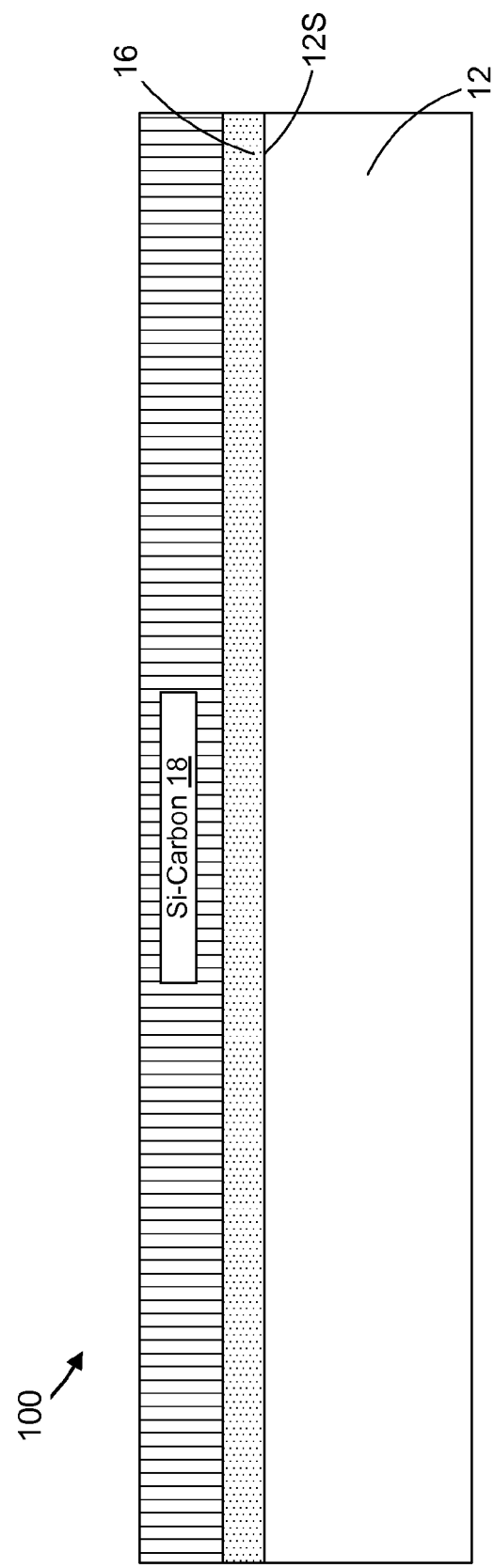
Figure 2C:
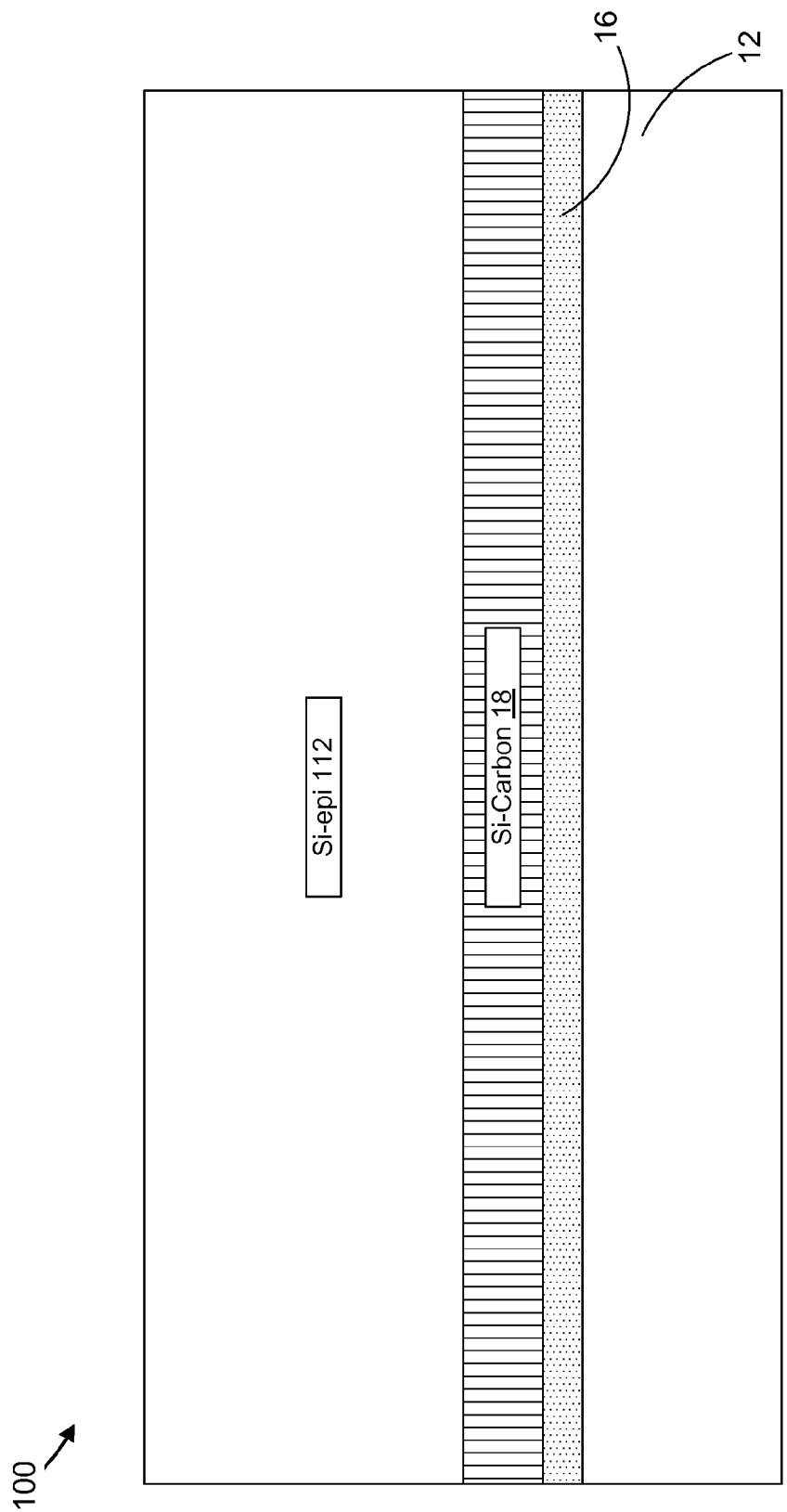
Figure 2D:
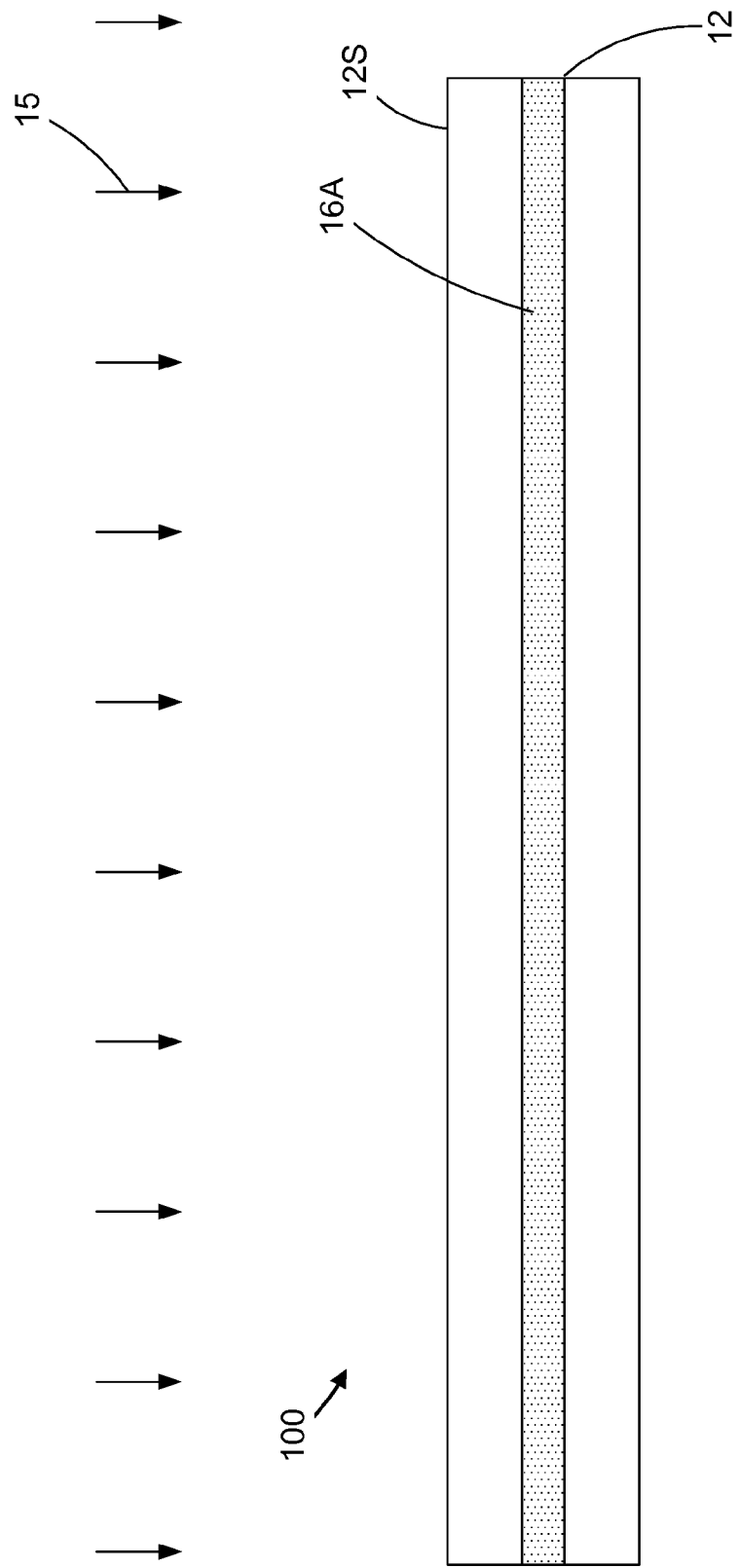
Figure 2E:
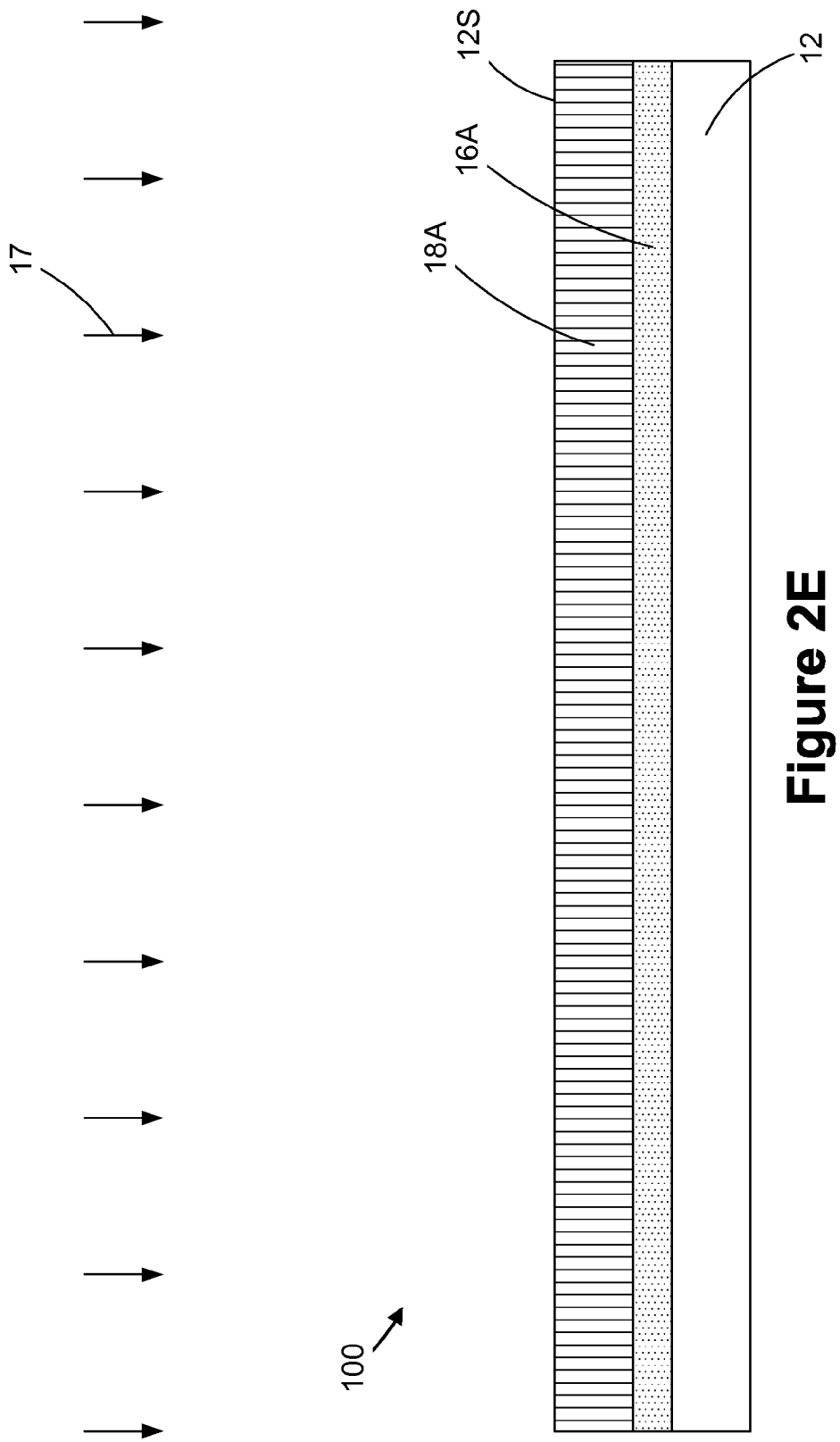

As shown in FIG. 2A, in one illustrative embodiment, a first doped buffer layer 16 is formed in or on the substrate 12, depending upon the manner in which it is made, e.g., by performing an epitaxial deposition process or by performing an ion implantation process to form the first doped buffer layer 16. In the example depicted in FIG. 2A, the first doped buffer layer 16 is a boron-doped epi semiconductor layer 16, e.g., boron-doped epi silicon, that is formed on the upper surface 12S of the substrate 12. Nitrogen, fluorine and boron can be used individually or in any combination to dope the first doped buffer layer 16. The thickness of the first doped buffer layer 16 and concentration of dopant, e.g., boron, of the first doped buffer layer 16 may vary depending upon the particular application. In one illustrative embodiment, the first doped buffer layer 16 may have a thickness of about 5 nm and it may have a boron concentration of about $10^{19}$ atoms/cm$^3$. In this example, the first doped buffer layer 16 may be formed by performing well-known epitaxial growth processes wherein the dopant material is introduced in situ, i.e., as the first doped buffer layer 16 is being formed. The thin first doped buffer layer 16 serves as a transition layer between the doped well and a second doped buffer layer (to be formed next in FIG. 2B) for less formation of defects.

Next, as shown in FIG. 2B, a second doped buffer layer 18, e.g., carbon-doped epi silicon, is formed on the upper surface of the first doped buffer layer 16. In some cases, if desired, nitrogen or fluorine can be added to the second doped buffer layer 18. The thickness of the second doped buffer layer 18 and concentration of carbon of the second doped buffer layer 18 may vary depending upon the particular application. In one illustrative embodiment, the second doped buffer layer 18 may have a thickness of about 5-15 nm and it may have a carbon concentration of about $10^{20}$ atoms/cm$^3$ or a volume density of about 2% of silicon. In this example, the second doped buffer layer 18 may be formed by performing well-known epitaxial growth processes wherein the dopant material is introduced in situ, i.e., as the second doped buffer layer 18 is being formed. The second doped buffer layer serves as a layer to suppress diffusion of most N-type and P-type dopants (e.g., B, P and As) from doped wells positioned below the second doped buffer layer.

FIG. 2C depicts the device 100 after a substantially un-doped or low-doped layer of semiconducting material layer 112, e.g., un-doped epi silicon, has been formed on the upper surface of the second doped buffer layer 18. By "substantially un-doped" it is meant that no dopant materials are intentionally included in manufacturing the substantially un-doped layer of semiconducting material 112. Thus, the substantially un-doped layer of semiconducting material 112 may have a dopant concentration of less than about $10^{15}$ atoms/cm$^3$. As a result, the combination device 100 that will be formed in the substantially un-doped layer of semiconducting material 112 will always be fully depleted during device operation. The thickness of the substantially un-doped layer of semiconducting material 112 may vary depending upon the particular application. In one illustrative embodiment, the substantially un-doped layer of semiconducting material 112 may have a thickness of about 20-80 nm. In this example, the substantially un-doped layer of semiconducting material 112 may be formed by performing well-known epitaxial growth processes.

As noted above FIGS. 2D-2E depict a situation wherein ion implantation processes are performed to form doped buffer layers 16A, 18A that correspond to the doped buffer layers 16, 18, respectively, that were discussed in connection with FIGS. 2A-2B above. More specifically, FIG. 2D depicts the situation where a first ion implantation process is performed to implant boron into the substrate 12 so as to thereby form a first doped buffer layer 16A in the substrate 12. The other dopant materials noted above may also be employed when forming the doped layers 16A, 18A using ion implantation processes. The concentration of boron in the first doped buffer layer 16A as well as the depth of the first doped buffer layer 16A may vary depending upon the particular application. In one illustrative example, the first doped buffer layer 16A may have a thickness of about 5 nm and it may have a boron concentration of about $10^{19}$ atoms/cm$^3$. The point of peak concentration of the first doped buffer layer 16A may be positioned about 10-20 nm below the upper surface 12S of the substrate 12. Depending upon the particular application, the first ion implantation process 15 may be performed using a dopant dose of about $1E^{15}$-$1E^{16}$ ion/cm$^2$ and an energy level that falls within the range of about 1-10 keV.

With reference to FIG. 2E, after the first doped buffer layer 16A is formed, a second ion implantation process 17 is performed to implant one or more dopant materials, e.g., carbon (and fluorine and/or nitrogen in some applications) into the substrate 12 so as to thereby form a second doped buffer layer 18A in the substrate 12. The concentration of dopant material, e.g., carbon, in the second doped buffer layer 18A as well as the depth or thickness of the second doped buffer layer 18A may vary depending upon the particular application. In one illustrative embodiment, the second doped buffer layer 18A may have a thickness or depth of about 5-15 nm and it may have a carbon concentration of about $10^{20}$ atoms/cm$^3$ or a volume density of about 2% of silicon. The point of peak concentration of the second doped buffer layer 18A may be positioned about 5-10 nm below the upper surface 12S of the substrate 12. Depending upon the particular application, the second ion implantation process 17 may be performed using a dopant dose of about $1E^{15}$-ion/cm$^2$ and an energy level that falls within the range of about 1-10 keV. At this time, if desired, an anneal process may be performed to repair any damage to the lattice structure of the substrate 12 or such anneal processes may be performed later in the subsequent process flow, i.e., after source/drain implant regions are formed in the fins on the FinFET devices.

Figure 2F:
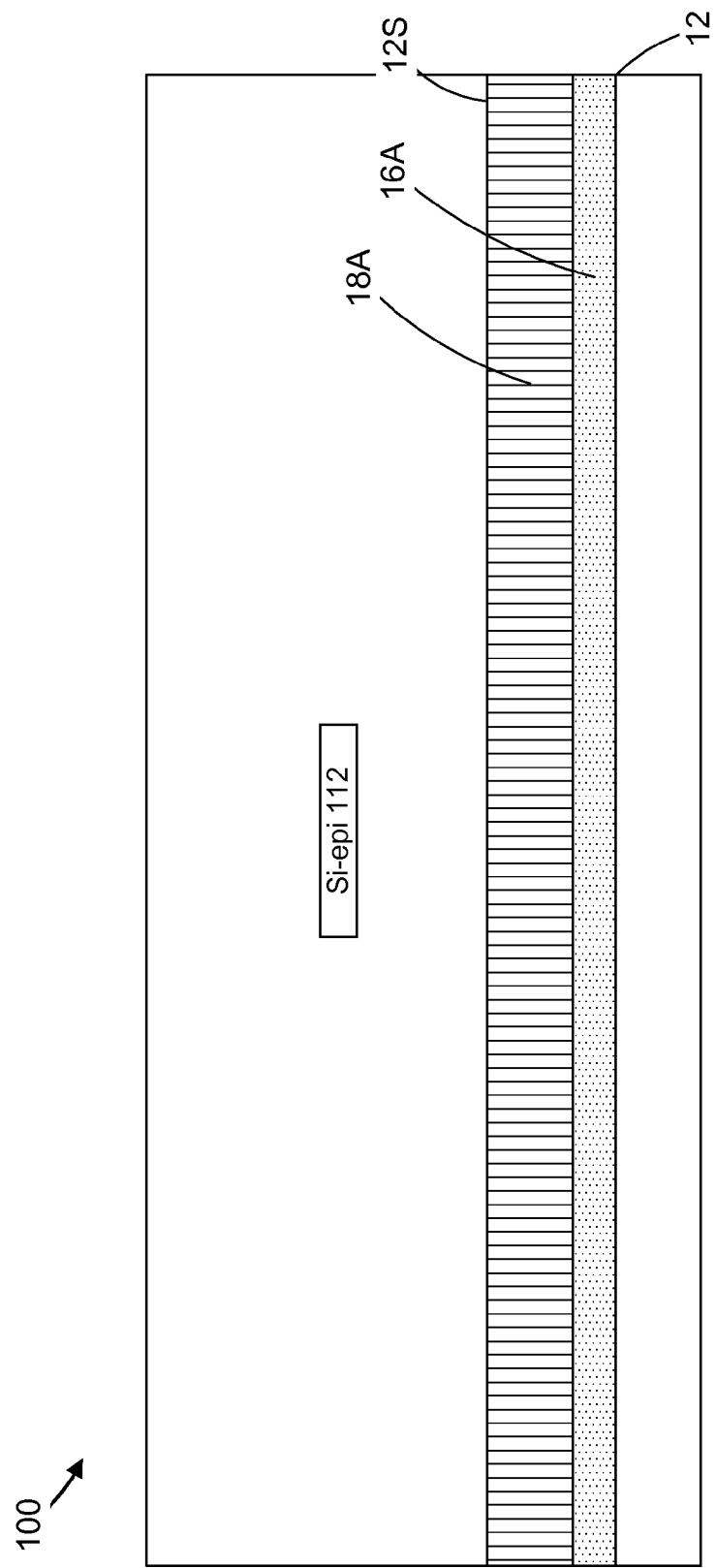

FIG. 2F depicts the device 100 after the previously described substantially un-doped layer of semiconducting material 112, e.g., un-doped epi silicon, has been formed on the upper surface of the second doped buffer layer 18A, i.e., on the upper surface 12S of the starting substrate 12.

Figure 2G:
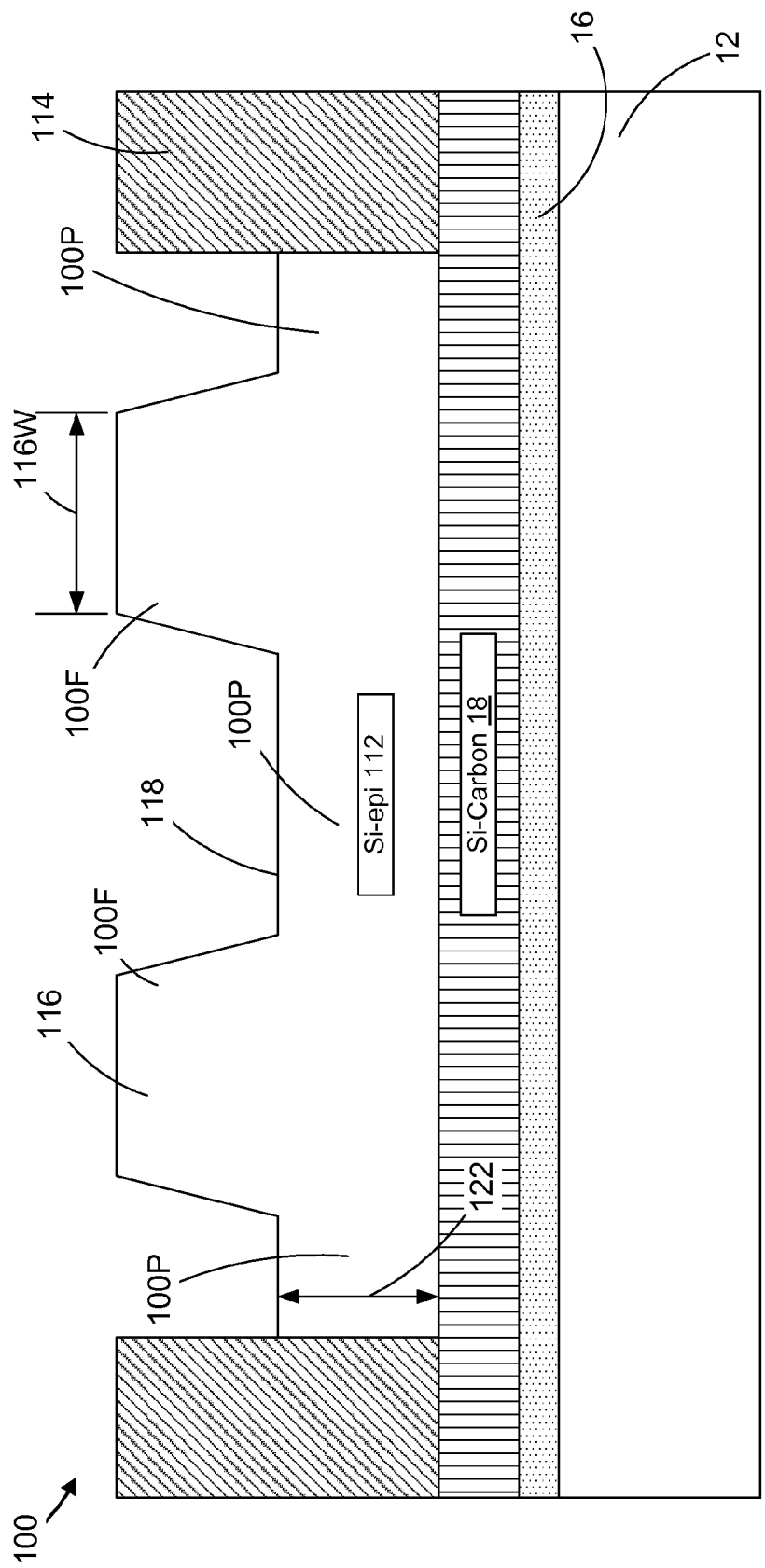

FIG. 2G depicts the illustrative example wherein the doped buffer layers 16, 18 have been formed on the device using epitaxial deposition/growth processes. However, as will be recognized by those skilled in the art after a complete reading of the present application, the process operations described in FIG. 2G could be applied equally to the structure depicted in FIG. 2F, i.e., the case where the doped buffer layers 16A, 18A are formed by performing the first and second ion implantation processes. Additionally, if desired, the doped layers may be formed by performing a combination of an ion implantation process and an epitaxial deposition/growth process. For example, in one embodiment, the first ion implantation process may be performed to form the first doped buffer layer 16A at or near the surface 12S of the substrate 12. Thereafter, an epitaxial deposition/growth process may be performed to form the second doped buffer layer 18, e.g., carbon-doped epi, above the first doped buffer layer 16A that was formed by performing the ion implantation process.

FIG. 2G further depicts the combination device 100 after several process operations have been performed. In one embodiment, the isolations regions 114 were initially formed in the substantially un-doped layer of semiconducting material 112 using traditional techniques, e.g., mask-etch-overfill with an insulating material—CMP. Thereafter, another mask layer was provided (not shown) and the trenches 118 were etched into the substantially un-doped layer of semiconducting material 112 to the desired depth such that thickness 122 of the layer 112 in the region of the substantially planar FET device portions 100P is at the desired thickness such that the combination device 100 will exhibit the desired performance characteristics. For example, in one embodiment, the thickness 122 may be about one-half of the overall thickness of the substantially un-doped layer of semiconducting material 112. The depth of the trenches 118 may be controlled using a variety of known techniques, e.g., a timed etching process. Additionally, during this etching process, the top width 116W of the fins 116 may be controlled by the mask layer, thereby causing the FINFET device portions 100F of the overall combination device 100 to exhibit the desired electrical performance characteristics as described above. Thereafter, the gate structure 130 (see FIG. 1C) may be formed on the device and traditional manufacturing operations may be performed to complete the fabrication of the novel combination device 100 disclosed herein.

Figure 3:
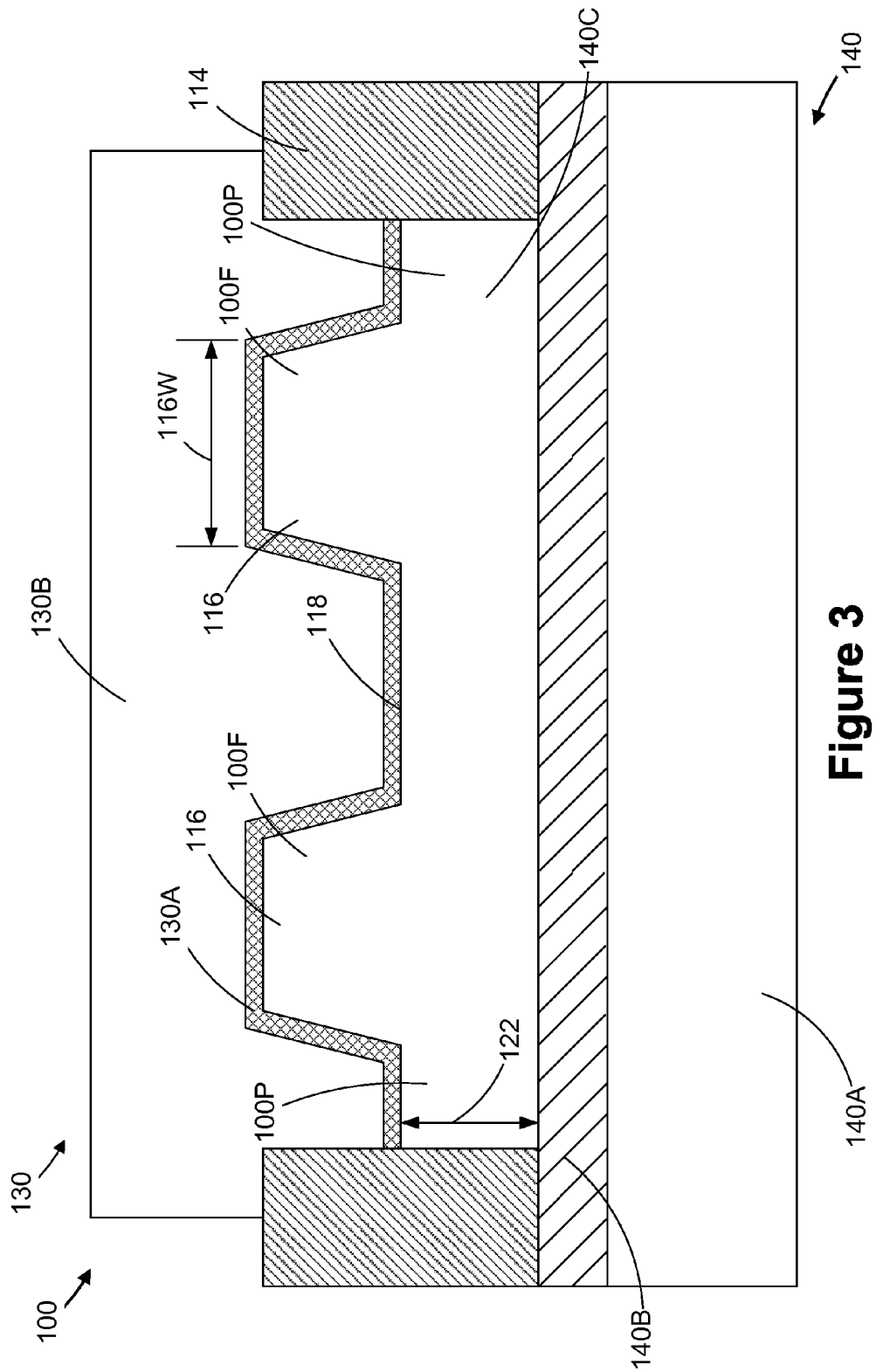
FIG. 3 depicts another illustrative embodiment of the novel combination semiconductor device disclosed herein.

FIG. 3 depicts an illustrative situation wherein the combination device 100 may be formed in a substantially un-doped active layer of an SOI substrate 140. That is, in one example, the SOI substrate 140—comprised of a bulk substrate 140A, an active layer 140C and a buried insulation layer 140B—may be obtained from the SOI vendor such that the active layer 140C is in a substantially un-doped condition. By "substantially un-doped," it is meant that no dopant materials are intentionally included in the active layer 140C when manufacturing the SOI substrate. Thus, the substantially un-doped active layer 140C may have a dopant concentration of less than about $10^{15}$ atoms/cm$^3$. As a result, the combination device 100 that will be formed in the substantially un-doped active layer 140C will always be fully depleted during device operation. The threshold voltage of the FINFET device portions 100F as well as the planar FET device portions 100P are mainly determined by the work function of the gate electrode materials and they may be modulated to a lesser extent by the top width 116W of the FINFET device portions 100F and the thickness 122 of the substantially planar FET device portions 100P. The thickness of the substantially un-doped active layer 140C may vary depending upon the particular application. By forming the combination device 100 in the substantially un-doped active layer 140C of an SOI substrate 140, the formation of the previously mentioned buffer layer 16, 16A, 18, 18A may not be required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A device, comprising:
   a substantially un-doped layer of a semiconducting material;
   a plurality of trenches defined in said substantially un-doped layer of semiconducting material, said trenches defining a plurality of fins, wherein each of said trenches has a bottom surface and wherein said bottom surfaces of said trenches define a planar channel region for said device;
   a gate insulation layer positioned on said fins and on a bottom surface of said trenches;
   a gate electrode positioned on said gate insulation layer; and
   a device isolation structure defined in said substantially un-doped layer of semiconducting material.

2. The device of claim 1, wherein said substantially un-doped layer of semiconducting material is one of a layer of epitaxially deposited silicon or an un-doped active layer of a silicon-on-insulator structure.

3. The device of claim 1, further comprising a doped buffer layer positioned adjacent said substantially un-doped layer of semiconducting material.

4. The device of claim 3, wherein said doped buffer layer comprises at least carbon as a dopant material.

5. The device of claim 4, wherein said doped buffer layer further comprises at least one of fluorine and nitrogen as a dopant material.

6. The device of claim 1, wherein the combination of said gate insulation layer and said gate electrode fill each of said plurality of trenches.

7. The device of claim 1, wherein said gate insulation layer is comprised of silicon dioxide and said gate electrode is comprised of polysilicon.

8. The device of claim 1, wherein said substantially un-doped layer of semiconductor material is a substantially un-doped layer of epitaxially grown silicon.

9. The device of claim 1, wherein said trenches extend to a depth that is approximately one-half of an overall thickness of said un-doped layer of semiconducting material.

10. A device, comprising:
    a substantially un-doped layer of a semiconducting material having an initial thickness;
    a plurality of trenches defined in said substantially un-doped layer of semiconducting material, said trenches defining a plurality of fins, each of said fins having a top width dimension that is different than a thickness of said substantially un-doped layer of semiconducting material at a bottom of at least one of said trenches, wherein each of said trenches has a bottom surface and wherein said bottom surfaces of said trenches define a planar channel region for said device;

a gate insulation layer positioned on said fins and on a bottom surface of said trenches;

a gate electrode positioned on said gate insulation layer; and a device isolation structure defined in said substantially un-doped layer of semiconducting material.

11. The device of claim 10, wherein said substantially un-doped layer of semiconducting material is one of a layer of epitaxially deposited silicon or an un-doped active layer of a silicon-on-insulator structure.

12. The device of claim 10, further comprising a doped buffer layer positioned adjacent said substantially un-doped layer of semiconducting material.

13. The device of claim 12, wherein said doped buffer layer comprises at least carbon as a dopant material.

14. The device of claim 13, wherein said doped buffer layer further comprises at least one of fluorine and nitrogen as a dopant material.

15. The device of claim 10, wherein the combination of said gate insulation layer and said gate electrode fill each of said plurality of trenches.

16. The device of claim 10, wherein said top width is greater than said thickness of said substantially un-doped layer of semiconducting material at a bottom of at least one of said trenches.

17. The device of claim 10, wherein said top width is less than said thickness of said substantially un-doped layer of semiconducting material at a bottom of at least one of said trenches.

18. A device, comprising:
a substantially un-doped layer of a semiconducting material;
a plurality of trenches defined in said substantially un-doped layer of semiconducting material, said trenches defining a plurality of fins, wherein each of said trenches has a bottom surface and wherein said bottom surfaces of said trenches defines a planar channel region for said device, wherein said trenches extend to a depth that is approximately one-half of an overall thickness of said un-doped layer of semiconducting material;
a gate insulation layer positioned on said fins and on a bottom surface of said trenches;
a gate electrode positioned on said gate insulation layer above the bottom surfaces of the trenches and around a portion of each of the plurality of fins; and
a device isolation structure defined in said substantially un-doped layer of semiconducting material.

19. The device of claim 18, wherein a top width of at least one of the fins is greater than a thickness of said substantially un-doped layer of semiconducting material at a bottom of at least one of said trenches.

20. The device of claim 18, wherein a top width of at least one of the fins is less than a thickness of said substantially un-doped layer of semiconducting material at a bottom of at least one of said trenches.

21. A device, comprising:
a substantially un-doped layer of a semiconducting material;
a doped buffer layer positioned adjacent said substantially un-doped layer of semiconducting material;
a plurality of trenches defined in said substantially un-doped layer of semiconducting material, said trenches defining a plurality of fins;
a gate insulation layer positioned on said fins and on a bottom surface of said trenches;
a gate electrode positioned on said gate insulation layer; and
a device isolation structure defined in said substantially un-doped layer of semiconducting material.

22. The device of claim 21, wherein said doped buffer layer comprises at least carbon as a dopant material.

23. The device of claim 22, wherein said doped buffer layer further comprises at least one of fluorine and nitrogen as a dopant material.

24. A device, comprising:
a substantially un-doped layer of a semiconducting material having an initial thickness;
a doped buffer layer positioned adjacent said substantially un-doped layer of semiconducting material;
a plurality of trenches defined in said substantially un-doped layer of semiconducting material, said trenches defining a plurality of fins, each of said fins having a top width dimension that is different than a thickness of said substantially un-doped layer of semiconducting material at a bottom of at least one of said trenches;
a gate insulation layer positioned on said fins and on a bottom surface of said trenches;
a gate electrode positioned on said gate insulation layer; and
a device isolation structure defined in said substantially un-doped layer of semiconducting material.

25. The device of claim 24, wherein said doped buffer layer comprises at least carbon as a dopant material.

26. The device of claim 24, wherein said doped buffer layer further comprises at least one of fluorine and nitrogen as a dopant material.

* * * * *